(12) United States Patent
Corisis

(10) Patent No.: US 6,229,202 B1
(45) Date of Patent: May 8, 2001

(54) SEMICONDUCTOR PACKAGE HAVING DOWNSET LEADFRAME FOR REDUCING PACKAGE BOW

(75) Inventor: David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/480,086

(22) Filed: Jan. 10, 2000

(51) Int. Cl.[7] .................. H01L 23/34; H01L 23/695
(52) U.S. Cl. ............... 257/666; 257/672; 257/673; 257/678; 257/676; 257/693; 257/648
(58) Field of Search ................ 257/666, 674–669, 257/676, 692, 678, 696, 698, 690

(56) References Cited

U.S. PATENT DOCUMENTS

| Re. 36,613 | * | 3/2000 | Ball ................................ 257/777 |
| 5,214,307 | | 5/1993 | Davis . |
| 5,220,195 | | 6/1993 | McShane et al. . |
| 5,291,059 | * | 3/1994 | Ishitsuka et al. ............... 257/646 |
| 5,365,107 | * | 11/1994 | Kuiaishi et al. ............... 257/673 |
| 5,437,915 | * | 8/1995 | Nishimura et al. ............ 428/202 |
| 5,442,231 | * | 8/1995 | Miyamoto et al. ............. 257/668 |
| 5,498,901 | | 3/1996 | Chillara et al. . |
| 5,594,234 | | 1/1997 | Carter, Jr. et al. . |
| 5,637,915 | * | 6/1997 | Sato et al. ..................... 257/666 |
| 5,638,596 | * | 6/1997 | McCormick ................... 257/666 |
| 5,767,570 | * | 6/1998 | Rostoker ........................ 257/668 |
| 5,767,572 | | 6/1998 | Fujitsu . |
| 5,770,479 | * | 6/1998 | Brooks et al. ................. 438/123 |
| 5,920,114 | * | 7/1999 | Beaumont ...................... 257/666 |
| 5,998,866 | * | 12/1999 | Ochi et al. ..................... 257/666 |
| 6,002,165 | | 12/1999 | Kinsman . |
| 6,043,430 | * | 3/2000 | Chun ............................. 257/672 |
| 6,049,125 | | 4/2000 | Brooks et al. . |
| 6,068,180 | * | 5/2000 | Test ............................... 228/180.5 |
| 6,075,283 | | 6/2000 | Kinsman et al. . |

OTHER PUBLICATIONS

Book of Semi Standards 1995, Packaging Volume, Specification Dimensions and Tolerances Used to Manufacture Plastic Molded Small Outline Package Tooling, SEMI 1985, pp. 175–178.

"Analysis of Warpage of LSI package", Copyright Nitto Denko 1999.

Lee Choon Kuan et al., "IC Package Warpage —Prediction and Control", TI Singapore MOS Memory Package Development Department, date unknown.

1994 Dram Data Book, Micron Semiconductor, Inc., Packaging Plastic TSOP, pp. 7–19, 1994.

* cited by examiner

*Primary Examiner*—Alexander O. Williams
(74) *Attorney, Agent, or Firm*—Stephen A. Gratton

(57) ABSTRACT

A bow resistant semiconductor package includes a semiconductor die, a leadframe segment and a plastic body. The leadframe segment includes lead fingers attached and wire bonded to the die, and opposing volume equalizing members proximate to lateral edges of the die. The volume equalizing members are downset from a first plane proximate to a face of the die, to a second plane proximate to a center line of the package. In addition, the volume equalizing members are configured to rigidify the package, and to substantially equalize the volumes of molding compound on either side of the package center line and leadframe segment. The equal volumes of molding compound reduce thermo-mechanical stresses enerated during cooling of the molding compound, and reduce package bow. With reduced package bow, a planarity of the terminal leads on the package is maintained. Also, stresses on bonded connections between the terminal leads and electrodes on a supporting substrate, such as a printed circuit board, or multi chip module substrate, are reduced.

30 Claims, 7 Drawing Sheets

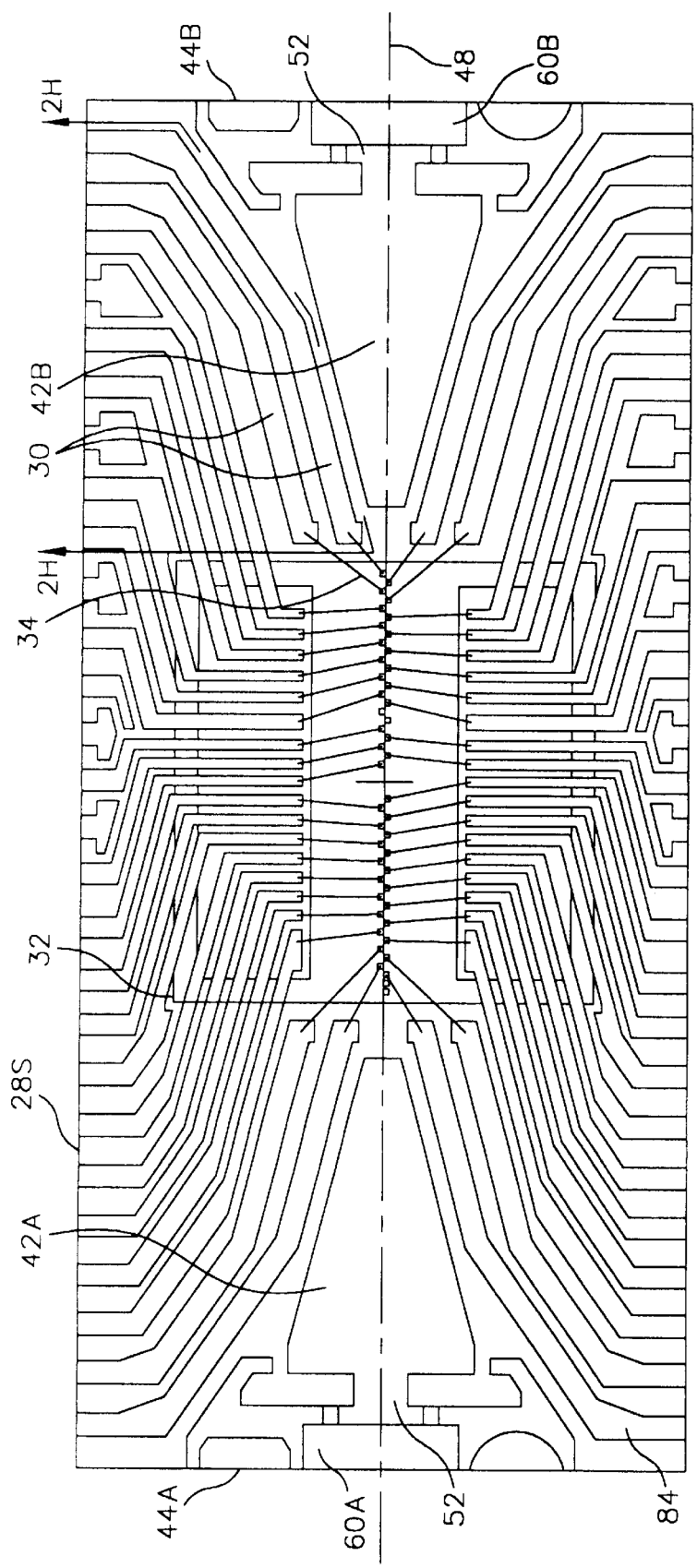
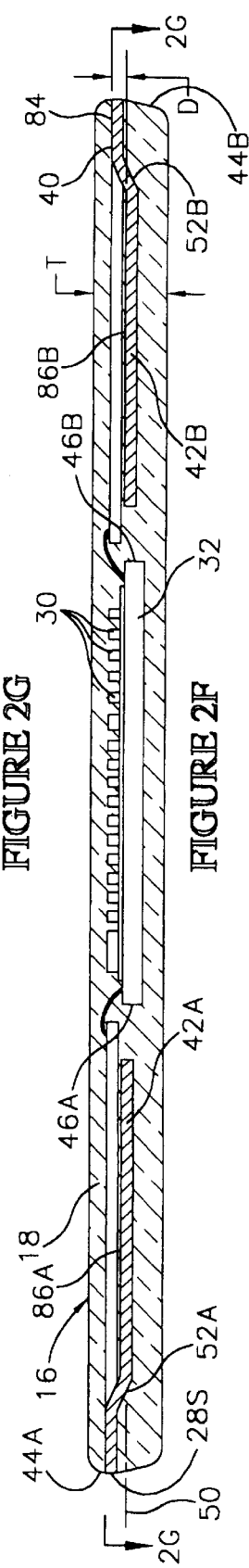
FIGURE 2G
FIGURE 2F

SEMICONDUCTOR PACKAGE HAVING DOWNSET LEADFRAME FOR REDUCING PACKAGE BOW

FIELD OF THE INVENTION

This invention relates generally to semiconductor packaging and specifically to a method for fabricating plastic semiconductor packages with reduced package bow.

BACKGROUND OF THE INVENTION

A conventional plastic semiconductor package includes a semiconductor die encapsulated in a molded plastic package body. The package body rigidities and protects the die from the environment. A plastic semiconductor package also includes a metal leadframe wire bonded to bond pads on the die. An adhesive member, such as polyimide tape, or alternately an adhesive layer on the lead frame, attaches the die to the leadframe. The leadframe forms terminal leads for the package and provides internal signal, power and ground paths through the package body to the die.

One aspect of a plastic semiconductor package is that the molded plastic body, the die, the leadframe and the adhesive tape comprise different materials, having different coefficients of thermal expansion (CTE). Because of the different coefficients of thermal expansion, thermomechanical stresses are generated within the package as the package is subjected to a temperature change. These stresses are particularly large during manufacture, as the package body cools from a relatively high molding temperature (e.g., 183° C.) to room temperature (e.g., 25° C.).

One problem that results from these thermo-mechanical stresses is referred to as "package bow" or "package warpage". FIGS. 1A–1C illustrate different types of package bow, or warpage, in plastic semiconductor packages. In FIG. 1A, a semiconductor package 10A includes a package body 12A and a plurality of terminal leads 14A extending from the body 12A on opposed longitudinal sides thereof. The package 10A has undergone a negative bow and has the profile of a "frown". Specifically, the package body 12A has bowed with respect to a theoretical flat profile FP by a warp distance X, which by convention is designated (−). In addition, some of the terminal leads 14A at the center of the package 10A are offset from a theoretical planar reference plane RP by an offset distance of Y.

In FIG. 1B, a semiconductor package 10B includes a package body 12B which has undergone a positive bow, and has the profile of a "smile". Specifically, the package body 12B has bowed with respect to the theoretical flat profile FP by the warp distance X, which by convention is designated (+). In addition, some of the terminal leads 14B at the ends of the package 10B are offset from the theoretical planar reference plane RP by the offset distance Y.

In FIG. 1C, a semiconductor package 10C includes a package body 12C which has undergone both negative and positive warp distances X, and has an "undulating" profile. In addition, some of the terminal leads 14C in the center of the package 10C, as well as some of the terminal leads 14C at an end of the package 10C, are offset from the theoretical reference plane RP by the offset distance Y.

In each of the packages 10A, 10B, 10C, the package bow has been illustrated as occurring along a longitudinal axis of the package. However, package bow can occur along any axis (e.g., lateral axis, diagonal axis) of the package 10A, 10B, 10C. Still further, package bow can be evaluated at any point on the package 10A, 10B, 10C. For example, one method for evaluating package bow is to measure the warp distance X at many different points on a major surface (e.g., top surface or bottom surface) of the package 10A, 10B, 10C. These measurements can be made using a surface laser profiler, a surface roughness meter, or with other conventional instruments known in the art.

Package bow can also be defined by a "warp factor". SEMI (Semiconductor Equipment and Materials International) defines the warp factor as the warp distance X in mils divided by the length of the package in inches (i.e., WF=X(mils)/L(inches)). SEMI standards (SEMI G37–88) for plastic molded small outline packages specify an acceptable warp factor as being 2.5 or less. SEMI standards (SEMI G37–88) also define package warpage as any non-linear dimensional change from the mold cavity characteristic.

One problem resulting from package bow is that the terminal leads 14A, 14B, 14C of the package are no longer co-planar. Without co-planar terminal leads 14A, 14B, 14C, surface mounting of the package 10A, 10B, 10C to a supporting substrate, such as a circuit board, can be difficult. SEMI standards (SEMI G37–88) for plastic molded small outline packages specify that lead co-planarity, measured in a vertical direction, must be within 3 mils (i.e., Y<3 mils). For making planarity measurements, the reference plane RP can be defined by the three lowest terminal leads 14A, 14B, 14C from the bottom of the package 10A, 10B, 10C. In addition to affecting lead planarity, in lead on chip packages (LOC), package bow can adversely affect the planarity of the lead fingers on the leadframe, and the adhesive bonds to the die.

Also with package bow, once the package is surface mounted to the supporting substrate, additional stresses are generated at the soldered connections between the terminal leads 14A, 14B, 14C and the supporting substrate. These stresses can cause solder joint failure, and can decrease the lifetime of the package 10A, 10B, 10C. Package bow can also cause problems during handling of the packages 10A, 10B, 10C by automated pick and place equipment, which requires planar surfaces for suction cups to operate properly.

Package bow is particularly troublesome in thin packages, such as thin small outline packages (TSOP). In addition, package bow has become more of a problem due to decreases in the thicknesses of semiconductor dice. Conventional semiconductor dice, for example, have recently decreased in thickness from about 28 mils to about 14 mils. At the same time the peripheral outline, or "footprint", of the dice is also smaller, such that the ratio of the package footprint to the die footprint is large. The thinner, smaller dice are more likely to bow in a package, and are less likely to provide a rigidifying structure in the package capable of resisting thermo-mechanical stresses.

In view of the foregoing, improved plastic semiconductor packages able to resist bowing, and improved methods for fabricating plastic semiconductor package with reduced bowing, are needed in the art.

SUMMARY OF THE INVENTION

In accordance with the present invention, a bow resistant plastic semiconductor package is provided. Also provided are a method for fabricating plastic semiconductor packages with reduced package bow, and improved electronic assemblies fabricated using the plastic semiconductor package.

The plastic semiconductor package includes a die, a leadframe segment attached to the die, and a package body comprising a molding compound encapsulating the die and the leadframe segment. In an illustrative embodiment, the package has the configuration of a thin small outline package (TSOP) having terminal leads in a gull wing configuration. Also in the illustrative embodiment, the leadframe segment and the die have a LOC (lead-on-chip) configuration, and an adhesive member attaches the die to lead fingers on the leadframe segment. In addition, wire bonds are formed between bond pads on the die, and the lead fingers on the leadframe segment, to provide electrical paths there between.

The leadframe segment also includes volume equalizing members configured to displace the molding compound of the plastic body, and to substantially equalize the volumes of molding compound on either side of a package center line, and on either side of the leadframe segment. With this configuration, the magnitude of thermo-mechanical stresses developed as the molding compound undergoes shrinkage during cooling are decreased. The package body is therefore less likely to bow, and cause the terminal leads and the lead fingers to become non-planar.

In the illustrative embodiment, the volume equalizing members comprise opposing paddles located along a longitudinal axis of the package proximate to the lateral edges of the die. The paddles include downset segments that downset the paddles from a first plane proximate to the face of the die, to a second plane proximate to a center line of the package and plastic body. In addition to helping to equalize the volume of the molding compound above and below the leadframe segment, the paddles also rigidify the package body for resisting package bow. In particular, the paddles and die taken together provide a rigidifying structure that extends substantially across the entire length of the package. In addition, the paddles occupy a space in the package body that a larger die would occupy, and thus form a rigidifying structure having a size substantially equal that of the larger die.

In addition to the paddles, one or more of the lead fingers of the leadframe segment can be configured as volume equalizing members having a downset substantially equal to the downset of the paddles. As another alternative, the lead fingers can be downset, and also upset to approximately the plane of the face of the die to provide a wire bonding surface, or alternately a die attach surface. In either case the lead fingers help to equalize the volume of molding compound above and below the leadframe segment and the package center line.

The method for fabricating the semiconductor package includes the steps of: providing a leadframe segment comprising the lead fingers and one or more volume equalizing members; attaching the die to the lead fingers; wire bonding the die to the lead fingers; and then molding the package body to the leadframe segment with the volume equalizing members rigidifying the package and substantially equalizing a volume of molding compound above and below the leadframe segment and the package center line.

The bow resistant package improves the construction of electronic assemblies such as printed circuit boards, and multi chip modules. In particular, stresses on bonded connections between the package leads and electrodes on a substrate of the assembly are substantially eliminated due to the planarity of the package leads.

BRIEF DESCRIPTION OF THE DRAWINGS

FIG. 2F is an enlarged cross sectional view of the package taken along section line 2F—2F of FIG. 2A;

FIG. 2G is an enlarged plan view of the package with parts removed taken along section line 2G—2G of FIG. 2F;

DETAILED DESCRIPTION OF THE PREFERRED EMBODIMENTS

Referring to FIGS. 2A–2G, a plastic semiconductor package 16 constructed in accordance with the invention is illustrated.

In the illustrative embodiment, the package 16 has the configuration of a thin small outline package (TSOP). However, the package 16 can be fabricated with any other conventional configuration including DIP (dual in line package), ZIP (zig zag in line package), PLCC (plastic leadless carrier), SOP (small outline package), SOJ (small outline j-bend), or PQFP (plastic quad flat package).

Figures 2A, 2B:
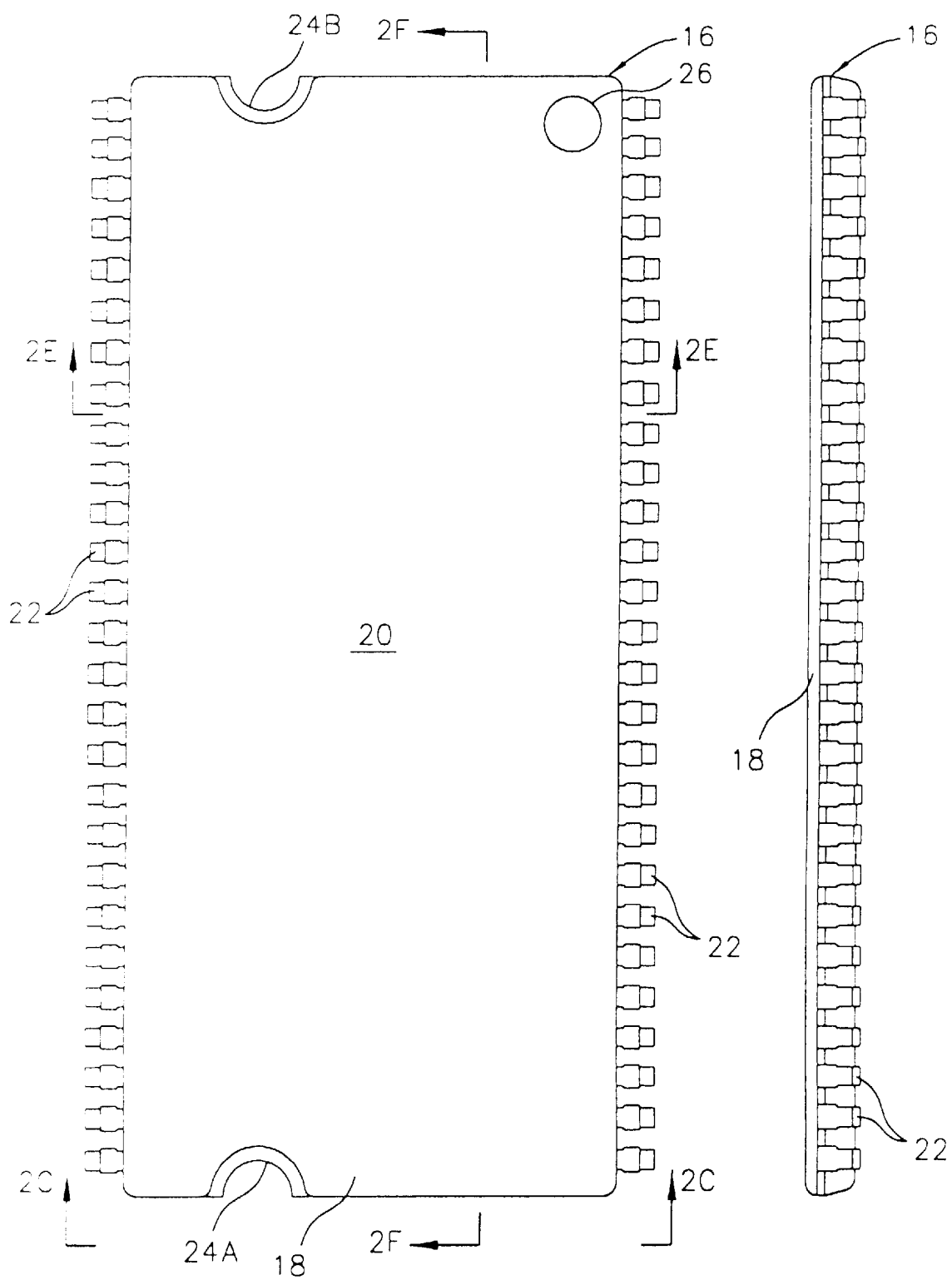
FIG. 2A is an enlarged plan view of a plastic semiconductor package constructed in accordance with the invention.
FIG. 2B is an enlarged side elevation view of the package.
Figure 2C:
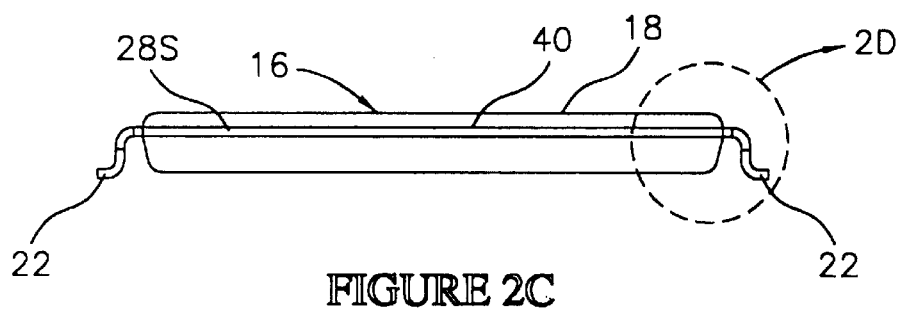
FIG. 2C is an enlarged end elevation view of the package taken along line 2C—2C of FIG. 2A.
Figure 2D:
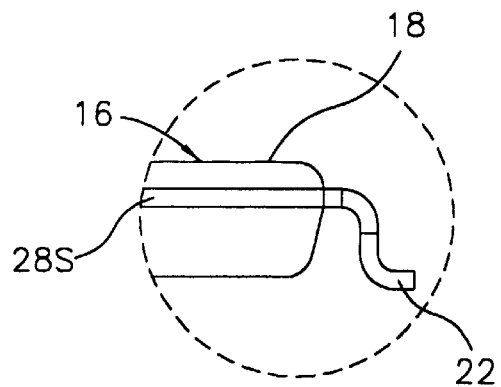
FIG. 2D is an enlarged view of a portion of FIG. 2C taken along line 2D of FIG. 2C illustrating a terminal lead on the package.

As shown in FIG. 2A, the package 16 includes a generally rectangular shaped plastic package body 18 which comprises a molding compound molded into a required shape. The package 16 also includes a plurality of terminal leads 22 projecting from the package body 18 along opposed longitudinal edges thereof. As shown in FIG. 2D, the terminal leads 22 have a gull wing configuration to permit surface mounting to a supporting substrate, such as a circuit board or a multi chip module substrate. Alternately the terminal leads 22 can have other conventional configurations such as integral standoff, J-bend and butt joint. As also shown in FIG. 2A, the package includes notches 24A, 24B along opposed lateral edges of the package body 18, and a molded pin #1 indicator 26 on an upper surface 20 of the package body 18.

Figure 2E:
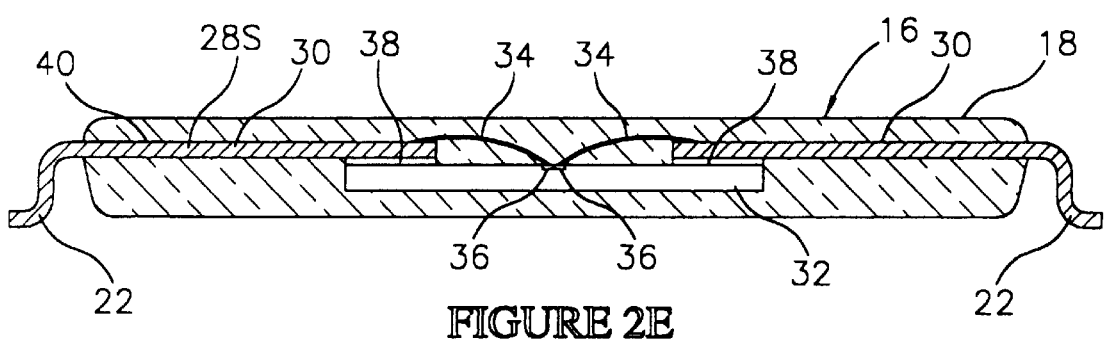
FIG. 2E is an enlarged cross sectional view of the package taken along section line 2E—2E of FIG. 2A.

As shown in FIG. 2E, the package 16 also includes a leadframe segment 28S encapsulated within the package body 18 using a molding process to be hereinafter described. In addition, the package 16 includes a semiconductor die 32 attached to the leadframe segment 28S and encapsulated within the package body 18. A package parting line 40 is located at the interface of the upper surface of the leadframe segment 28S and the package body 18. In the illustrative embodiment, the leadframe segment 28S and the die 32 have a LOC (lead-on-chip) configuration, such that lead fingers 30 of the leadframe segment 28S attach to the die 32 and form the terminal leads 22 for the package 16. Alternately, the leadframe segment 28S and the die 32 can have other conventional configurations.

A pair of adhesive members 38 attach the face of the die 32 to the underside of the lead fingers 30. The adhesive members 38 can comprise LOC tape (e.g., polyimide tape coated with an adhesive), or can comprise an adhesive layer (e.g., polyimide) applied directly to the lead fingers 30. In addition, wire bonds 34 are made between the lead fingers 30 on the leadframe segment 28S, and the bond pads 36 on the face of the die 32. The bond pads 36 are in electrical communication with electrical circuits and semiconductor devices contained on the die 32. The wire bonds 34 thus form separate electrical paths from the electrical circuits and semiconductor devices to the terminal leads 22.

Referring to FIGS. 2F and 2G, the leadframe segment 28S also includes opposed volume equalizing paddles 42A, 42B located on either side of the die 32. The volume equalizing paddles 42A, 42B extend from lateral peripheral edges 44A, 44B of the package 16, and are proximate to, but spaced from, lateral peripheral edges 46A, 46B of the die 32.

As shown in FIG. 2F, the volume equalizing paddles 42A, 42B have a downset D with respect to the major planar surface 84 of the leadframe segment 28S. The paddles 42A, 42B include downset segments 52A, 52B that connect the paddles 42A, 42B to siderails 60A, 60B of the leadframe segment 28S. The downset D can be measured from the major planar surface 84 of the leadframe segment 28S to a downset upper surface 86A, 86B of the paddles 42A, 42B. The amount of the downset D can be selected such that the center lines of the paddles 42A, 42B are located approximately along a center line 50 (FIG. 2F) of the package 16 and of the package body 18. In addition, the center line 50 (FIG. 2F) is located at the approximate midpoint of the thickness T of the package 16 and the package body 18. With this configuration there are substantially equal volumes of molding compound in the package body 18 on either side of the paddles 42A, 42B, and on either side of the center line 50.

In addition, the paddles 42A, 42B have a geometry and a location selected to maximize the volume equalizing function, and also to rigidify the package 18 as much as possible. Specifically, the paddles 42A, 42B have a relatively large surface area in order to displace a substantial volume of molding compound. In the illustrative embodiment, the paddles 42A, 42B are generally triangular in shape and have a surface area that is approximately equal to the surface area of the die 32. By way of example and not limitation, a representative range for the combined surface area of the paddles 42A, 42B can be from about 30 mm$^2$ to 80 mm$^2$.

Also, the paddles 42A, 42B are located along a longitudinal axis 48 (FIG. 2G) of the package 16, such that the package body 18 is reinforced along substantially the entire length of the package 18 by the paddles 42A, 42B and by the die 32. In this regard, the paddles 42A, 42B can be located as close as possible to the lateral edges 46A, 46B (FIG. 2F) of the die 32. With the paddles 42A, 42B having a combined surface area approximately equal to that of the die 32, a rigidifying structure is provided that is approximately twice the size of the die 32. The package 16 thus has a rigidity approximately equal to a package having a die that is twice the size of the die 32.

Figure 2H:
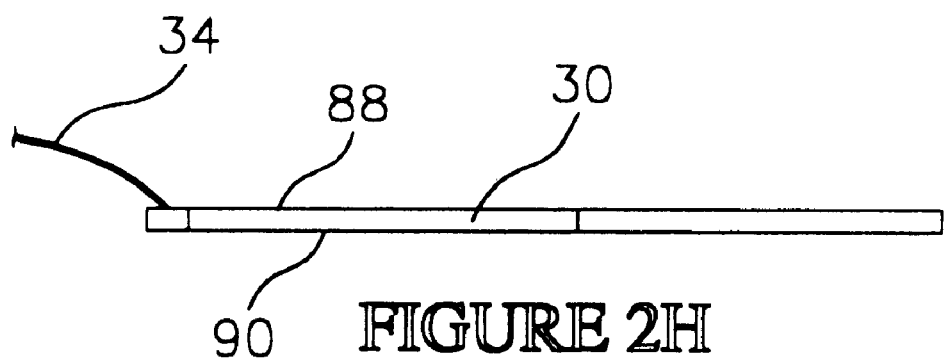
FIG. 2H is an enlarged cross sectional view taken along section line 2H—2H of FIG. 2G illustrating a lead finger of the package.

As shown in FIG. 2H, the lead fingers 30 of the leadframe segment 28S can be substantially planar members having upper surfaces 88 that are planar to the major surface 84 (FIG. 2F) of the leadframe segment 28S. Also in the package 16, the lower surfaces 90 of the lead fingers 30 are approximately planar to the face of the die 32 and attach to the adhesive members 38 to the face of the die 32.

Figure 2I:
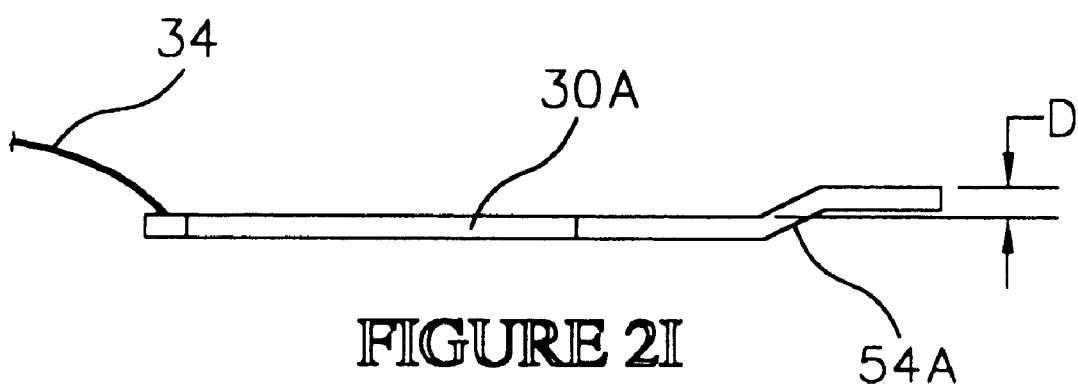
FIG. 2I is an enlarged cross sectional view equivalent to FIG. 2H of an alternate embodiment downset lead finger.

Alternately, as shown in FIG. 2I, one or more lead fingers 30A can have a downset segment 54A having a downset D that is substantially equal to the downset D (FIG. 2F) of the volume equalizing paddles 42A, 42B. The lead fingers 30A thus downset from approximately the major planar surface 84 of the leadframe segment 28S to the plane of the package center line 50 (FIG. 2F). In this embodiment, the lead fingers 30A also function as volume equalizing members such that there are substantially equal volumes of molding compound on either side of the lead fingers 30A, and on either side of the center line 50 for the package 16 and package body 18.

Figure 2J:
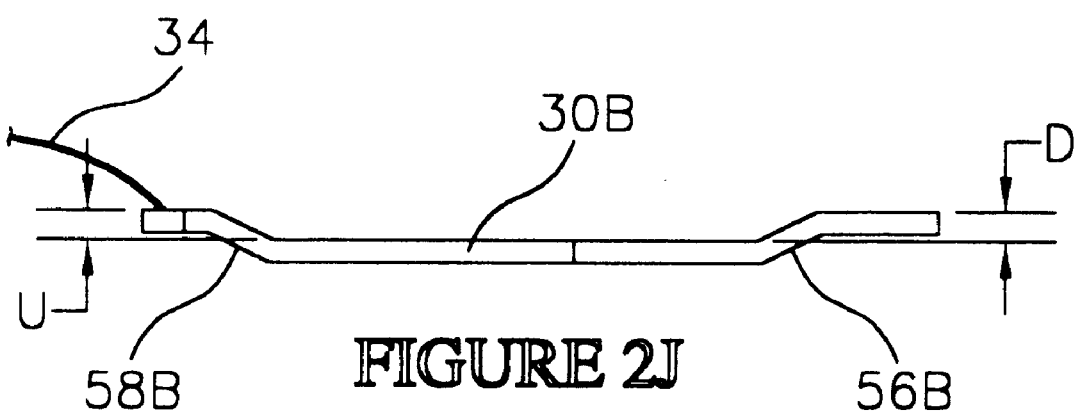
FIG. 2J is an enlarged cross sectional view equivalent to FIG. 2H of an alternate embodiment downset-upset lead finger.

Alternately, as shown in FIG. 2J, one or more lead fingers 30B can have a downset segment 56B having a downset D that is substantially equal to the downset D (FIG. 2F) of the volume equalizing paddles 42A, 42B. In addition, the lead fingers 30B can have an upset segment 58B having an upset U that is substantially equal to the downset D. This arrangement allows the lead fingers 30B to function as volume equalizing members substantially as previously described for lead fingers 30A. This arrangement also allows the wire bonds 34 to be located on the lead fingers 30B along a plane that is substantially planar to the bond pads 36 (FIG. 2E) on the face of the die 32. This arrangement can also be utilized to attach the lead fingers 30B to the face of the die 32 as portions of the lead fingers 30B proximate to the die 32 are approximately planar to the face of the die 32.

Figure 3A:
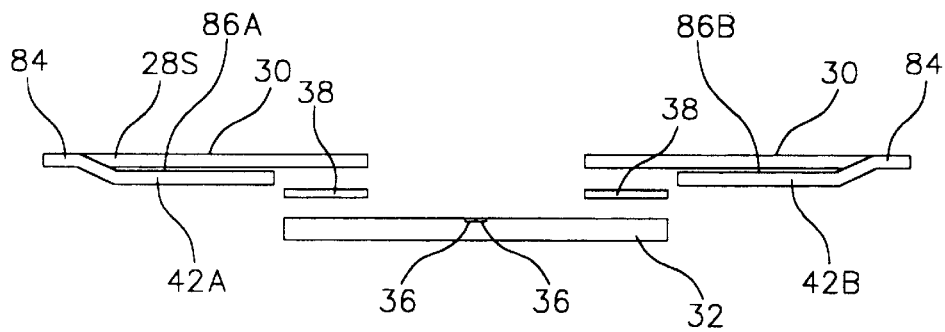
FIGS. 3A–3D are enlarged schematic cross sectional views illustrating steps in a method for fabricating the package in accordance with the invention.
Figure 4:
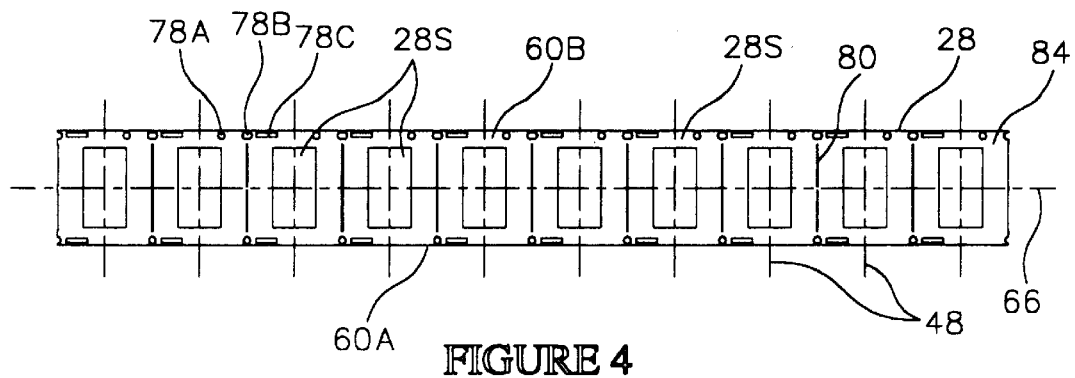
FIG. 4 is a schematic plan view of a leadframe used in the fabrication of the package.

Referring to FIGS. 3A≧3D and FIG. 4, steps in a method for fabricating the semiconductor package 16 are illustrated. Initially, as shown in FIG. 3A, the leadframe segment 28S, the adhesive members 38 and the semiconductor die 32 are provided. The leadframe segment 28S includes the lead fingers 30, and the volume equalizing paddles 42A, 42B, as previously described. Also, the lead fingers 30 can be configured as volume equalizing members as with lead fingers 30A (FIG. 2I) and 30B (FIG. 2J).

As shown in FIG. 4, the leadframe segment 28S is initially contained on a leadframe 28 which contains a plurality of leadframe segments 28S. For simplicity in FIGS. 3A–3D only a single leadframe segment 28S is illustrated. However, it is to be understood that the fabrication method is performed on the leadframe 28, such that a plurality of packages 16 are fabricated at the same time. Following the fabrication process, the leadframe segments 28S can be singulated by cutting or shearing the leadframe 28 into individual packages 16.

As also shown in FIG. 4, each of the leadframe segments 28S is oriented along a longitudinal axis 48, and is attached to the parallel spaced siderails 60A, 60B of the leadframe 28. In addition, the leadframe 28 includes a central axis 66 which runs the length of the leadframe 28 generally orthogonal to the longitudinal axes 48. The siderails 60A, 60B of the leadframe 28 includes multiple through openings 78A, 78B, 78C which permit the lead frame 28 to be handled by automated transfer mechanisms associated with chip bonders, wire bonders, molds, trim and form machinery, and marking machinery. The lead frame 28 also includes elongated separation openings 80 to facilitate singulation of the lead frame 28 into separate packages 16. The lead frame 28 can be formed of metal using a stamping process, or a chemical milling process. Suitable metals for the lead frame 28 include nickel-iron alloys (e.g., 42% Ni-58% Fe), clad materials (e.g., copper clad stainless steel), or copper alloys.

Figure 3B:
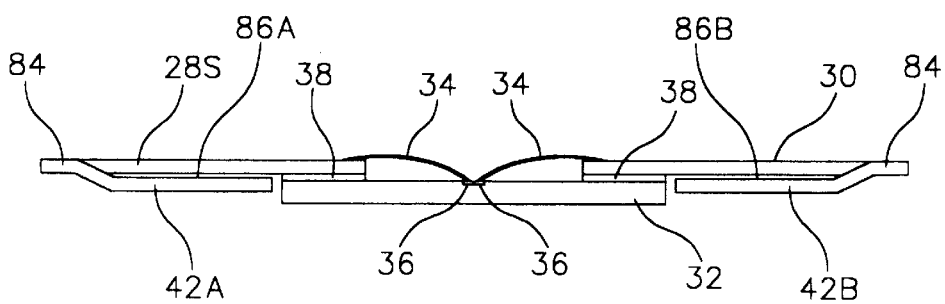

Next, as shown in FIG. 3B, the die 32 is attached to the lead fingers 30 of the leadframe segment 28S using the adhesive members 38. The die attach step can be performed using conventional die attach equipment and procedures. As also shown in FIG. 3B, the wire bonds 34 are formed between the die bond pads 36 and corresponding connection points on the lead fingers 30. Conventional wire bonding equipment can be used to form the wire bonds 34.

Figure 3C:
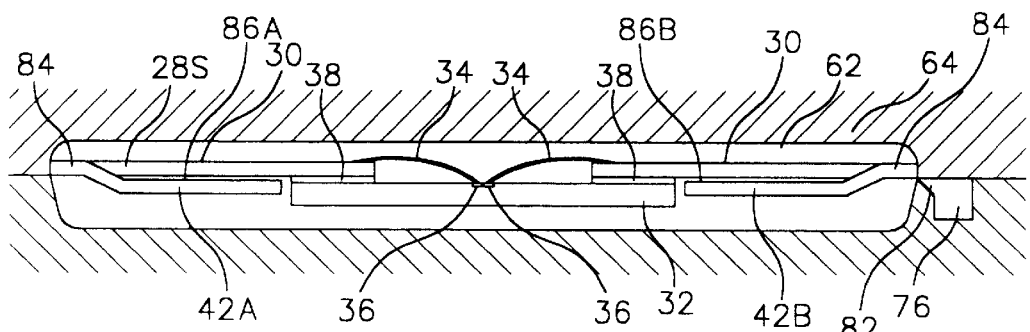

Next, as shown in FIG. 3C, a transfer molding press 64 is provided. The transfer molding press 64 includes a mold cavity 62, a mold cavity gate 82 in flow communication with the mold cavity 62, and a runner 76 in flow communication with a source of pressurized molding compound. Using the transfer molding press 64 and the mold cavity 62, the package body 18 can be molded over the leadframe segment 28S and the die 32. The molding compound for the package body 18 can comprise a conventional molding compound such as an epoxy resin in a B-stage condition. In addition, conventional parameters can be utilized for the molding process including conventional pressures and temperatures.

Figure 3D:
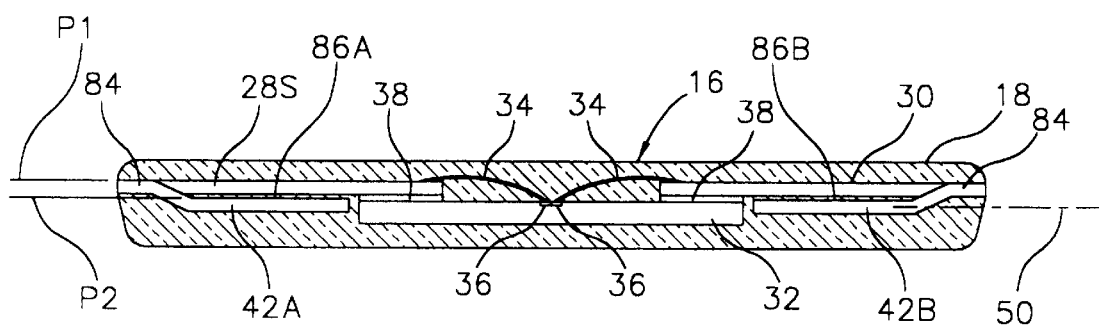

As shown in FIG. 3D, following the transfer molding step, the package body 18 encapsulates the die 32, encapsulates the wire bonds 34, and encapsulates the leadframe segment 28S. The dimensions and the geometry of the mold cavity 62 can be selected to form the package body 18 with required dimensions and geometry. In the completed package 16, the volume equalizing paddles 42A, 42B are downset from a first plane P1 which comprises the surface of the leadframe segment 28S and lead fingers 30, to a second plane P2 which comprises the upper surfaces 86A, 86B of the volume equalizing paddles 42A, 42B. In addition, the second plane P2 is proximate to the center line 50 of the package 16 but offset from the center line 50 by about one half a thickness of the volume equalizing paddles 42A, 42B.

As previously explained, a volume of molding compound on either side of the volume equalizing members 42A, 42B, and on either side of the center line 50 of the package, are substantially equal due to the configuration of the volume equalizing members 42A, 42B. During cooling of the molding compound, thermo mechanical stresses are less likely to be generated in the package body 18 due to these substantially equal volumes. In addition, a magnitude of the thermal mechanical stresses that do develop is less, such that micro cracks are less likely to occur in the structure of the package body 18.

In addition, the volume equalizing members 42A, 42B and the die 32 provide a rigidifying structure that extends substantially along the entire length of the package center line 50 and longitudinal axis 48 (FIG. 2G). This rigidifying structure helps the package body 18 to resist bowing resulting from the thermal mechanical stresses.

Figure 1A:
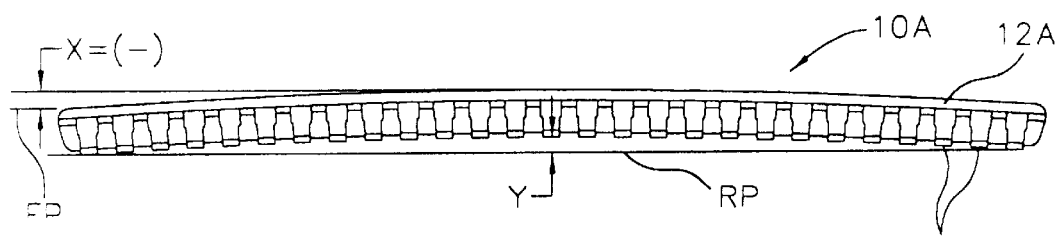
FIG. 1A is a schematic side elevation view of a prior art plastic semiconductor package having a negative bow.
Figure 1B:
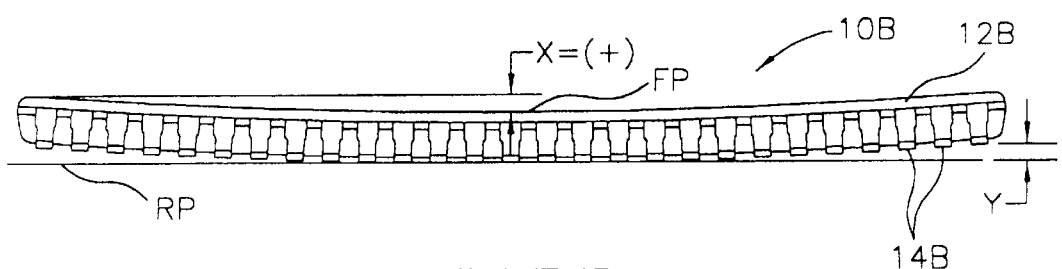
FIG. 1B is a schematic side elevation view of a prior art plastic semiconductor package having a positive bow.
Figure 1C:
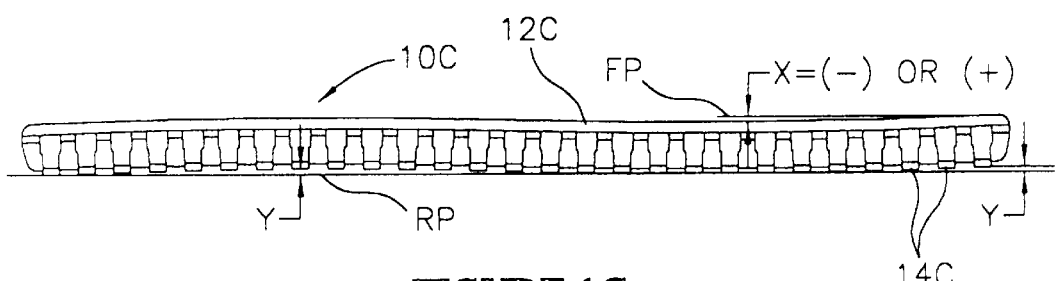
FIG. 1C is a schematic side elevation view of a plastic semiconductor package having multiple bows.

Due to the volume equalizing and rigidifying functions of the volume equalizing members 42A, 42B, a package bow X (FIG. 1A) measured from a theoretical flat profile FP (FIG. 1A) can also be less than about 3 mils (0.003 inches= 0.075 mm). In addition, a planarity of the terminal leads 22 (FIG. 2E) can be maintained such that the offset Y (FIG. 1A) between any lead 22, and a theoretical reference plane RF (FIG. 1A) can be less than about 3 mils (0.003 inches=0.075 mm). Further, the planarity of the lead fingers 30 and associated points of attachment with the die 32 can be maintained.

Figure 5:
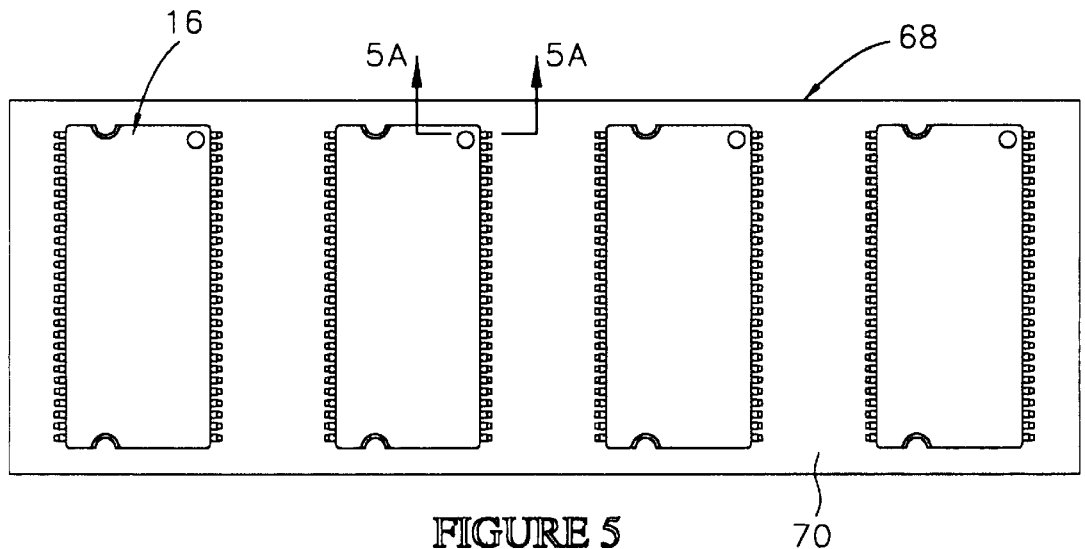
FIG. 5 is a plan view of an electronic assembly constructed using packages fabricated in accordance with the invention.
Figure 5A:
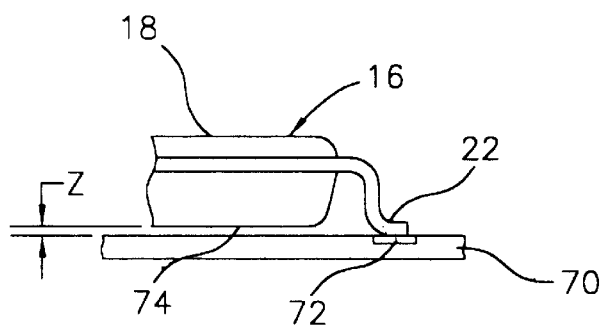
FIG. 5A is an enlarged cross sectional view taken along section line 5A—5A of FIG. 5.

Referring to FIGS. 5 and 5A, an electronic assembly 68 fabricated using semiconductor packages 16, constructed in accordance with the invention is illustrated. The electronic assembly 68 can be configured as a printed circuit board, a multi chip module, or a sub assembly of electronic product such as a field emission display. The electronic assembly includes a supporting substrate 70 and a plurality of packages 16, surface mounted to the supporting substrate 70. Depending on the application, the supporting substrate 70 can comprise a ceramic, a plastic or a printed circuit board material (e.g., FR-4).

The terminal leads 22 of the package 16, are bonded to corresponding electrodes 72 (FIG. 5A) on the supporting substrate 70, using a suitable bonding process such as soldering, or curing of a conductive polymer. Because the terminal leads 22 are substantially co-planar, stress loads between the terminal leads 22, and the electrodes 72 are substantially reduced. In addition, an offset Z between the lower surface 74 of the package 16, and the supporting substrate 70 can be accurately maintained without generating stress loads.

Thus the invention provides an improved bow resistant plastic semiconductor package, and a method for fabricating plastic semiconductor packages with reduced package bow. In addition, the package can be used to fabricate improved electronic assemblies such as multi chip modules without stressing bonded connections to a supporting substrate.

While the invention has been described with reference to certain preferred embodiments, as will be apparent to those skilled in the art, certain changes and modifications can be made without departing from the scope of the invention as defined by the following claims.

What is claimed is:

1. A semiconductor package comprising:
    a semiconductor die comprising a face and a plurality of bond pads on the face;
    a molded package body comprising a molding compound encapsulating the die and having a center line; and
    a leadframe segment attached to the die and encapsulated in the plastic body, the leadframe segment comprising a plurality of lead fingers attached to the face and wire bonded to the bond pads, and at least one volume equalizing member configured to substantially equalize a volume of the molding compound on either side of the center line.

2. The semiconductor package of claim 1 wherein the volume equalizing member comprises opposing downset paddles.

3. The semiconductor package of claim 1 wherein the volume equalizing member comprises a pair of downset paddles having a combined surface area approximately equal to a surface area of the die.

4. The semiconductor package of claim 1 wherein the lead fingers are wire bonded to the die.

5. The semiconductor package of claim 1 wherein the lead fingers are downset.

6. A semiconductor package comprising:
    a semiconductor die having a face and a surface area;
    a molded package body having a center line and comprising a molding compound encapsulating the die; and
    a leadframe segment attached to the die and encapsulated in the plastic body, the leadframe segment comprising a plurality of lead fingers attached to the die, and a plurality of volume equalizing members located proximate to the center line and having a combined surface area approximately equal to the surface area of the die, the members configured to substantially equalize a volume of the molding compound on either side of the center line.

7. The semiconductor package of claim 6 wherein the volume equalizing members comprise opposing paddles proximate to opposing lateral edges of the die and downset from a surface of the leadframe segment to the center line.

8. The semiconductor package of claim 6 wherein the volume equalizing members comprise lead fingers downset from a surface of the leadframe segment to the center line.

9. The semiconductor package of claim 1 wherein the volume equalizing members comprise lead fingers downset from a surface of the leadframe to the center line and upset from the center line to the surface.

10. A semiconductor package comprising:
a semiconductor die having opposing peripheral edges and a surface area;
a molded package body having a center line and comprising a molding compound encapsulating the die; and
a leadframe segment encapsulated in the package body comprising a plurality of lead fingers attached to the die and oriented along a first plane, and a pair of opposing volume equalizing members proximate to the peripheral edges and downset from the first plane to a second plane proximate to the center line, the volume equalizing members having a combined surface area approximately equal to the surface area of the die and configured to substantially equalize a volume of the molding compound on either side of the center line.

11. The package of claim 10 wherein the package body has a longitudinal axis and the volume equalizing members comprise generally planar paddles located along the longitudinal axis.

12. The package of claim 10 wherein the volume equalizing members comprise a plurality of opposing lead fingers downset from the first plane to the second plane.

13. The package of claim 10 wherein the volume equalizing members comprise a plurality of opposing lead fingers downset from the first plane to the second plane and upset from the second plane to the first plane.

14. The package of claim 10 wherein the leadframe segment has a lead on chip (LOC) configuration.

15. The package of claim 10 wherein the package has a thin small outline package (TSOP) configuration.

16. A semiconductor package comprising:
a semiconductor die comprising a face, a plurality of bond pads on the face, and opposing peripheral edges;
a molded package body comprising a molding compound encapsulating the die; and
a leadframe segment attached to the die and encapsulated in the plastic body, the leadframe segment comprising a plurality of lead fingers attached to the face of the die and wire bonded to the bond pads, the leadframe segment further comprising a pair of opposing volume equalizing members proximate to the peripheral edges, downset from a first plane to a second plane, and configured to rigidify the leadframe segment and to substantially equalize a volume of the molding compound on either side of the volume equalizing members.

17. The package of claim 16 wherein the package has a longitudinal axis and the volume equalizing members rigidify the package body along the longitudinal axis.

18. The package of claim 16 wherein the volume equalizing members and the die rigidify the package body along substantially an entire length thereof.

19. The package of claim 16 wherein at least some of the lead fingers are downset from the first plane to the second plane.

20. The package of claim 16 wherein the leadframe segment has a lead on chip (LOC) configuration.

21. The package of claim 16 wherein the package has a thin small outline package (TSOP) configuration.

22. A semiconductor package having a longitudinal axis and comprising:
a semiconductor die having opposing peripheral edges;
a leadframe segment attached to the die; and
a molded package body substantially encapsulating the die and at least a portion of the leadframe;
a volume equalizing member comprising a pair of paddles on the leadframe segment proximate to the peripheral edges, the paddles and the die configured to rigidify the package along the longitudinal axis, the paddles shaped and dimensioned such that the molded package body comprises substantially equal volumes of a molding compound on either side of the leadframe segment.

23. The semiconductor package of claim 22 wherein the paddles extend from opposing lateral edges of the package body proximate to opposing lateral edges of the die.

24. The semiconductor package of claim 22 wherein the volume equalizing member further comprises a plurality of downset lead fingers wire bonded to the die.

25. The semiconductor package of claim 22 wherein the volume equalizing member further comprises a plurality of downset and upset lead fingers attached to the die.

26. An electronic assembly comprising:
a substrate comprising a plurality of electrodes;
a plastic semiconductor package on the substrate comprising:
a semiconductor die;
a leadframe segment comprising a plurality of lead fingers in electrical communication with the die and a plurality of terminal leads bonded to the electrodes; and
a molded package body substantially encapsulating the die and at least a portion of the leadframe segment;
a volume equalizing member comprising a pair of opposing paddles on the leadframe segment configured such that the molded package body comprises substantially equal volumes of a molding compound on either side of the leadframe segment.

27. The assembly of claim 26 wherein the die and the paddles are configured to rigidify the package along substantially an entire length thereof.

28. The assembly of claim 26 wherein the die has a surface area and the paddles have a combined surface area approximately equal to the surface area.

29. An electronic assembly comprising:
a substrate comprising a plurality of electrodes;
a plastic semiconductor package on the substrate having a longitudinal axis and comprising:
a semiconductor die;
a leadframe segment attached to the die and comprising a plurality of terminal leads bonded to the electrodes;
a molded package body substantially encapsulating the die and at least a portion of the leadframe segment, and having a center line;
a plurality of volume equalizing members on the leadframe segment configured to rigidify the package and dimensioned such that the molded package body comprises substantially equal volumes of a molding compound on either side of the center line and the package is rigidified along the longitudinal axis by the members and the die.

30. The assembly of claim 29 wherein the volume equalizing members comprise opposing paddles extending from lateral edges of the package body to lateral edges of the die.

* * * * *